US00RE40567E

(19) United States
(12) Reissued Patent
Fazio

(10) Patent Number: US RE40,567 E
(45) Date of Reissued Patent: Nov. 11, 2008

(54) FLASH MEMORY DEVICE OF CAPABLE OF SENSING A THRESHOLD VOLTAGE OF MEMORY CELLS ON A PAGE MODE OF OPERATION

(75) Inventor: Albert Fazio, Saratoga, CA (US)

(73) Assignee: Intel Corporation, Santa Clara, CA (US)

(21) Appl. No.: 10/080,958

(22) Filed: Feb. 21, 2002

Related U.S. Patent Documents

Reissue of:
(64) Patent No.: 5,742,543
Issued: Apr. 21, 1998
Appl. No.: 08/876,117
Filed: Jun. 13, 1997

U.S. Applications:
( 63) Continuation of application No. 08/699,490, filed on Aug. 19, 1996, now abandoned.

(51) Int. Cl.
*G11C 11/34* (2006.01)

(52) U.S. Cl. ..... 365/185.21; 365/185.26; 365/185.12; 365/185.24; 365/185.18

(58) Field of Classification Search ..... 365/185.21, 365/185.26, 185.12, 185.13, 185.24, 185.18, 365/185.01, 185.03
See application file for complete search history.

(56) References Cited

U.S. PATENT DOCUMENTS

| | | | | |
|---|---|---|---|---|
| 4,202,044 | A | | 5/1980 | Beilstein, Jr. et al. |
| 4,357,685 | A | | 11/1982 | Daniele et al. |
| 4,388,702 | A | | 6/1983 | Sheppard |
| 4,415,992 | A | | 11/1983 | Adlhoch |
| 4,460,982 | A | | 7/1984 | Gee et al. |
| 4,586,163 | A | | 4/1986 | Koike |
| 4,890,259 | A | | 12/1989 | Simko |
| 4,989,179 | A | | 1/1991 | Simko |
| 5,043,940 | A | | 8/1991 | Harari |
| 5,095,344 | A | | 3/1992 | Harari |
| 5,163,021 | A | | 11/1992 | Mehrotra et al. |
| 5,172,338 | A | | 12/1992 | Mehrotra et al. |
| 5,218,569 | A | | 6/1993 | Banks |
| 5,220,531 | A | | 6/1993 | Blyth et al. |
| 5,287,305 | A | | 2/1994 | Yoshida |
| 5,293,560 | A | | 3/1994 | Harari |
| 5,303,189 | A | | 4/1994 | Devin et al. |
| 5,408,429 | A | * | 4/1995 | Sawada ..... 365/185.01 |
| 5,428,568 | A | | 6/1995 | Kobayashi et al. |
| 5,572,465 | A | | 11/1996 | Bashir |
| 5,742,543 | A | * | 4/1998 | Fazio ..... 365/185.21 |
| 5,819,243 | A | | 10/1998 | Rich et al. |
| 5,862,330 | A | | 1/1999 | Anupam et al. |
| 5,881,014 | A | * | 3/1999 | Ooishi ..... 365/226 |
| 5,991,796 | A | | 11/1999 | Anupam et al. |

FOREIGN PATENT DOCUMENTS

| | | |
|---|---|---|
| JP | 57-17659 A | 10/1982 |
| WO | WO 90/12400 | 10/1990 |
| WO | WO 92/12519 | 7/1992 |
| WO | 00/20240 | 8/2000 |

* cited by examiner

*Primary Examiner*—Viet Q Nguyen
(74) *Attorney, Agent, or Firm*—Blakely, Sokoloff, Taylor & Zafman LLP

(57) ABSTRACT

A method for determining data stored by a memory cell. The memory cell has a select gate coupled to a wordline, a first electrode coupled to a bitline, and a second electrode coupled to a conductor. The method comprises: floating the bitline; applying a first voltage to the wordline; applying a second voltage to the conductor such that the bitline is set to a third voltage that is equal to the first voltage minus a threshold voltage of the memory cell; and sensing the third voltage to determine the data stored by the memory cell.

18 Claims, 8 Drawing Sheets

FLASH MEMORY DEVICE OF CAPABLE OF SENSING A THRESHOLD VOLTAGE OF MEMORY CELLS ON A PAGE MODE OF OPERATION

Matter enclosed in heavy brackets [ ] appears in the original patent but forms no part of this reissue specification; matter printed in italics indicates the additions made by reissue.

This is a continuation of application Ser. No. 08/699,490, filed Aug. 19, 1996, now abandoned.

FIELD OF THE INVENTION

The present invention relates generally to memory devices and more particularly to a nonvolatile memory device having a page mode of operation.

BACKGROUND OF THE INVENTION

Nonvolatile memory devices such as Electrically Programmable Read Only Memories ("EPROMs"), Electrically Erasable Programmable Read Only Memories ("$E^2$PROMs"), and flash EEPROMs include an array of nonvolatile memory cells and supporting periphery circuitry for accessing the array. A nonvolatile memory cell typically behaves like a field effect transistor and includes a select (or control) gate that controls the reading and writing of data to the memory cell and a floating gate that traps charge to alter the datum or data stored by the memory cell.

As charge is added to the floating gate of a memory cell, the threshold voltage $V_t$ of the memory cell increases, and the memory cell drain current $I_D$ ("cell current") decreases. The memory cell threshold voltage $V_t$ is related to the memory cell drain current $I_D$ by the expression:

$$I_D \alpha G_m \times (V_G - V_t) \text{ for } V_D > V_G - V_t$$

wherein $G_m$ is the transconductance of the memory cell; $V_G$ is the memory cell gate voltage; $V_D$ is the memory cell drain voltage; and $V_t$ is the memory cell threshold voltage.

Given this relationship, there are a number of prior art methods for sensing the amount of charge stored on of the floating gate of the memory cell, including the following:

1) sensing the cell current of a memory cell when a constant voltage is applied to the select gate of the memory cell;
2) sensing the amount of voltage required at the select gate to give rise to an expected cell current for the memory cell;
3) sensing a voltage drop across a load that is coupled to the drain of the memory cell when a constant voltage is applied to the select gate of the memory cell, wherein the cell current determines the amount of the voltage drop across the load; and
4) sensing the amount of voltage required at the select gate to give rise to an expected voltage drop across a load that is coupled to the drain of the memory cell.

Once sensed, the amount of charge determined to be stored on the floating gate is decoded to correspond to one of n possible states, n being two or more, and the binary representation ($\log_2 n$) of the determined state is output. One disadvantage of the above-described methods, all of which require an active cell current, is that a relatively large amount of current is required for sensing each cell, which reduces the maximum number of cells that may be sensed in parallel.

FIG. 1 shows a prior sensing system 5 that is used to sense the state of, and therefore the data stored by, nonvolatile memory cell 10. Nonvolatile memory cell 10 includes a select gate SG, a floating gate FG, a source S, and a drain D. Memory cell 10 operates as a field effect transistor (FET) having a variable threshold voltage $V_t$ that is changed by adding and removing charge from the floating gate FG. Because memory cell 10 operates as a field effect transistor, the electrodes shown in FIG. 1 as the drain D and the source S may interchangeably be used as either source or drain depending upon the particular configuration of memory cell 10 and the operating characteristics applied thereto.

As shown, the prior art sensing system 5 detects the amount of cell drain current $I_D$ that results from applying a read voltage $V_G$ to the select gate SG of memory cell 10. Depending upon the amount of charge stored on the floating gate FG of memory cell 10, the cell current $I_D$ may vary anywhere from zero to approximately 100 microamperes when the read voltage $V_G$ is applied to select gate SG.

The select gate SG of memory cell 10 is coupled to a wordline (not shown) to receive the read voltage $V_G$, the drain of memory cell 10 is coupled to a bitline (not shown) to which sensing system 5 is coupled to detect the strength of the cell current $I_D$, and the source of memory cell 10 is coupled to a ground potential $V_{SS}$ to give rise to the cell current $I_D$ that flows from the drain to the source as shown. Thus, memory cell 10 operates as a pull-down device.

A corresponding pull-up device is found in column load circuit 19. Column load circuit 19 is shown as including a transistor 20 that is biased to operate as a pull up device by a gate voltage $V_{bias}$. A drain bias circuit 12 is coupled between the drain D of memory cell 10 and column load circuit 19 to ensure that the drain D of memory cell 10 does not drop below a predetermined voltage (e.g. approximately one volt). Drain bias circuit 12 is shown as including a cascode transistor 15 and feedback circuitry 17. Feedback circuitry 17 provides a necessary voltage to the gate of transistor 15 such that the drain D of memory cell 10 does not drop below the predetermined voltage.

Once the read voltage $V_G$ is applied to the select gate SG of memory cell 10, the amount of charge trapped on floating gate FG determines the strength of the cell current $I_D$ and the strength of the pull-down provided by memory cell 10. Typically, if the memory cell 10 is erased, memory cell 10 acts as a strong pull-down device to overcome the pull-up provided by column load circuit 19 such that the negative input of a differential sense amplifier 25 is discharged towards ground. Sense amplifier 25 compares the voltage at its negative input to the voltage at its positive input, which is supplied by a reference circuit 30. According to common prior techniques, reference circuit 30 includes a reference cell (not shown) that has its floating gate charged to a predetermined level coupled to a drain bias circuit and column load circuit identical to those shown of sensing system 5.

Using the sensing scheme embodied by sensing system 5 requires a relatively large amount of current to read memory cell 10. For example, each of the memory cell 10, the drain bias circuit 12, and the sense amplifier 25 require current for operation and therefore result in power consumption. The amount of power consumption required by these components of sensing system 5 results in the ability of sensing system 5 to sense relatively few memory cells (e.g. 16 or 32) in parallel.

SUMMARY AND OBJECTS OF THE INVENTION

Therefore, it is one object of the present invention to provide a method for sensing more nonvolatile memory cells in parallel than previously allowed by typical prior art methods.

It is a further object of the present invention to use the method to provide a page mode of operation for a nonvolatile memory device.

It is a further object of the present invention to provide a method for sensing the cell threshold of memory cell rather than the cell current of the memory cell.

It is a further object of the present invention to provide a method for sensing a memory cell without using a drain bias circuit or a differential sense amplifier.

A method for determining data stored by a memory cell is described. The memory cell has a select gate coupled to a wordline, a first electrode coupled to a bitline, and a second electrode coupled to a conductor. The method comprises: floating the bitline; applying a first voltage to the wordline; applying a second voltage to the conductor such that the bitline is set to a third voltage that is equal to the first voltage minus a threshold voltage of the memory cell; and sensing the third voltage to determine the data stored by the memory cell. For one embodiment, the memory cell is a nonvolatile memory cell.

Other objects, features, and advantages of the present invention will be apparent from the accompanying drawings and from the detailed description which follows below.

BRIEF DESCRIPTION OF THE DRAWINGS

The present invention is illustrated by way of example and not limitation in the figures of the accompanying drawings, in which like references indicate similar elements, and in which.

DETAILED DESCRIPTION

A method and associated apparatus are described herein that provide for sensing the data stored by an entire wordline of a memory device in parallel without the excessive consumption of current. The advantages of the present described method and apparatus are provided, in part, by performing read operations of the memory cells without requiring an active cell current $I_D$ (i.e. approximately zero DC cell current). Because no cell current is required to sense the data stored by the nonvolatile memory, the amount of power required to read each cell is reduced sufficiently to allow for an entire selected wordline of memory cells to be read simultaneously. Wherein the amount of time required to form a single read operation using the described methods may, under some circumstances, be longer than the amount of time required to read a memory cell using some prior at schemes, the fact that many more memory cells can be sensed in parallel allows the sensing time to be amortized over many more cells so that the average amount of time to read each cell is significantly reduced and performance is increased.

Figure 2:
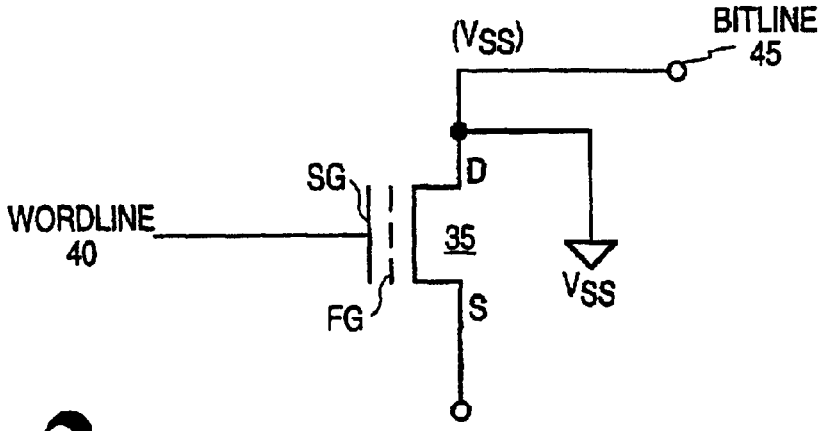
FIG. 2 is a nonvolatile memory cell configured according to one steps of a method for sensing data stored in the nonvolatile memory cell.
Figure 3:
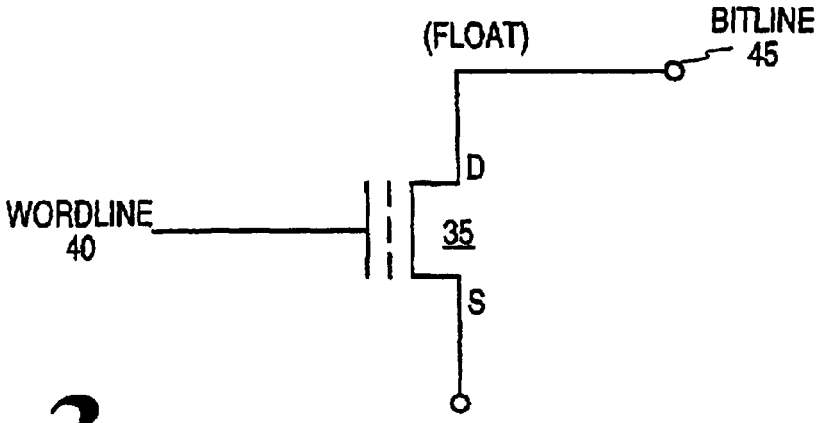
FIG. 3 is the nonvolatile memory cell of FIG. 2 configured according to another step of the method for sensing data stored in the nonvolatile memory cell.
Figure 4:
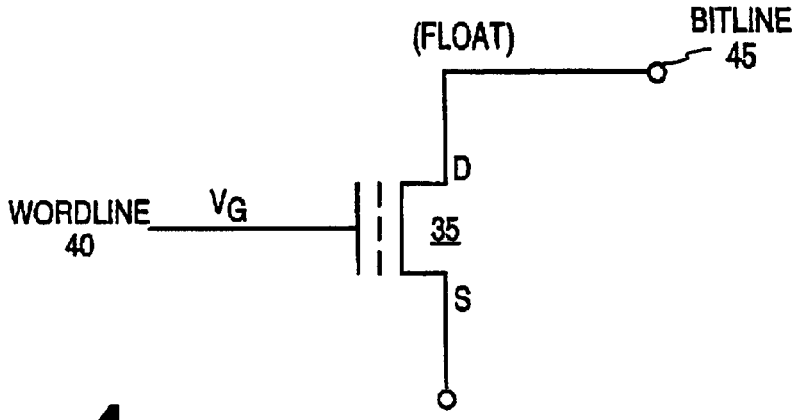
FIG. 4 is the nonvolatile memory cell of FIG. 2 configured according to another step of the method for sensing data stored in the nonvolatile memory cell.

The sensing system that operates according to present embodiments, as described with respect to FIGS. 2–10, does not require the drain bias circuit, a differential sense amplifier, or an active cell current in order to accurately sense the amount of charge stored on the floating gate of a memory cell. Instead, the sensing system and method described herein uses a source bias and an analog-to-digital converter (ADC) to detect the state of a cell in a manner that will be described below. FIGS. 2–5 diagrammatically illustrate the manner in which the state of a memory cell may be sensed according to the present embodiments. FIG. 2 shows a memory cell 35 having its select gate SG coupled to a wordline 40, its "drain" D coupled to a bitline 45, and its source S floating. The process of sensing the state of memory cell 35 is begun in FIG. 2 by setting the voltage of bitline 45, and therefore the "drain" D of memory cell 35, to system ground $V_{SS}$. Alternatively, the drain D of memory cell 35 may not first be set to $V_{SS}$. As shown in FIG. 3, the ground potential $V_{SS}$ is removed from bitline 45 such that both the "drain" D and "source" S of memory cell 35 are floating. As shown in FIG. 4, a read voltage $V_G$ is then applied to wordline 40 while a bitline 45 and the source of memory cell 35 remain floating.

Figure 5:
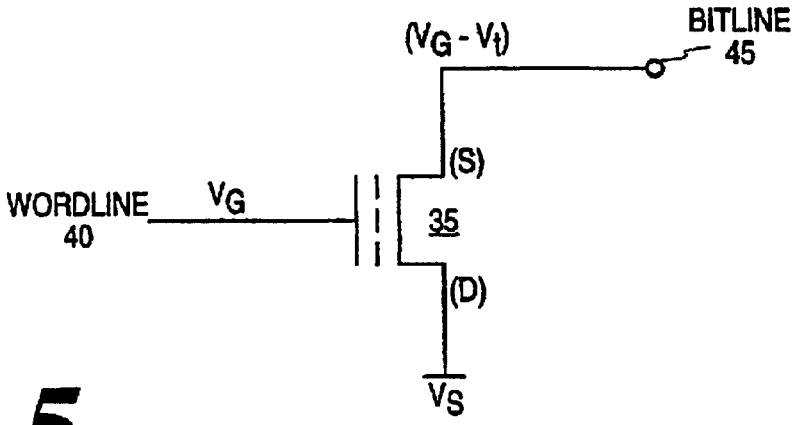
FIG. 5 is the nonvolatile memory cell of FIG. 2 configured according to another step of the method for sensing data stored in the nonvolatile memory cell.

In FIG. 5, a source voltage $V_S$ is applied to the "source" S of memory cell 35, which results in the "drain" D of memory cell 35 being pulled up to a voltage proportional to $(V_G-V_t)$. The value of the voltage of the bitline 45 may be sensed, for example, using an analog to digital converter.

Applying the source voltage $V_S$ to memory cell 35 actually results in the functions of the "drain" and "source" of memory cell 35 reversing such that what was formerly the "drain" of memory cell 35 now operates as the "source" of memory cell 35, and vice versa.

The method and system shown in FIGS. 2–5 enables the actual cell threshold voltage Vt of memory cell 35 to be sensed. Many prior schemes sense the cell current $I_D$ and not the cell threshold voltage Vt of a memory cell. The cell current $I_D$ is a function of many parameters that can lead to sources of variation in the cell current $I_D$ from memory cell to memory cell.

When memory cell 35 is a flash memory cell, the cell threshold voltage Vt determines the cell current $I_D$. Therefore, in order to reduce the variability of the sensed data stored in memory cells, it is preferable to sense the cell threshold voltage Vt rather than the cell current $I_D$. Additionally, many of a flash memory cell's parameters rely on the cell threshold voltage Vt, not the cell current $I_D$. For instance, the programming of a flash memory cell is directly proportional to the cell threshold voltage Vt, not the cell current $I_D$. In addition, disturb mechanisms (charge loss and charge gain) are related to the cell threshold voltage Vt.

Therefore, it is preferable to sense the cell threshold voltage Vt rather than the cell current $I_D$.

Figure 1:
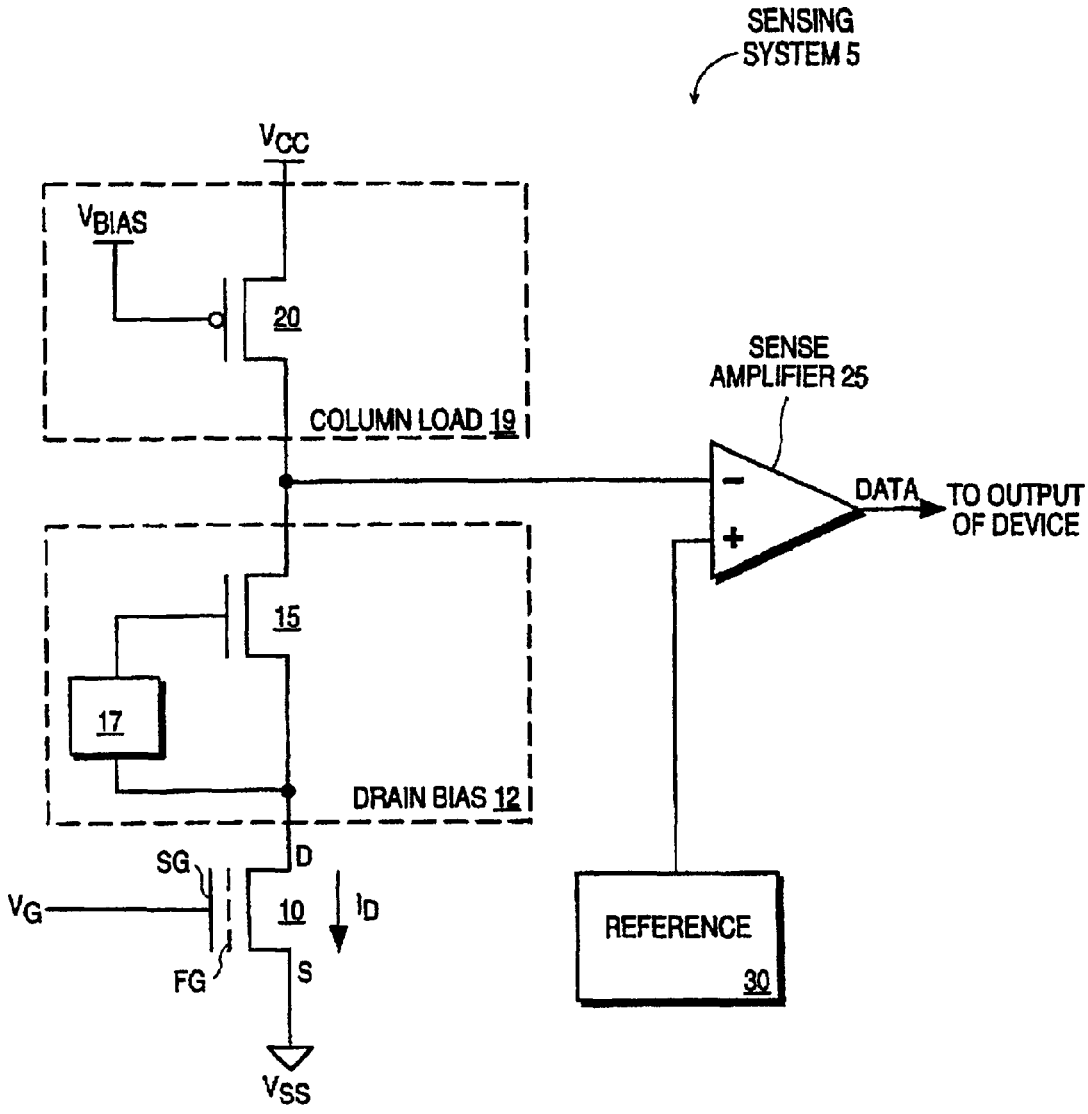
FIG. 1 (PRIOR ART)
FIG. 1 is prior art circuit diagram of a sensing system including a memory cell, a drain bias circuit, a column load circuit, and a differential sense amplifier.

The scheme illustrated in FIGS. 2–5 does not require an active cell current $I_D$, the use of a drain bias circuit, or a differential sense amplifier. Therefore, substantially less power is required to sense data stored by memory cell 35 as opposed to prior memory cells (e.g. memory cell 10 of FIG. 1). The reduced power required to sense data stored in memory cell 35 enables more memory cells to be sensed or read in parallel than previous schemes would allow. For one embodiment, an entire wordline of memory cells (e.g. 1024) may be sensed in parallel.

According to the present embodiments, both the read voltage $V_G$ applied to the wordline 40 and the source voltage $V_S$ are selected in view of the operating characteristics of the memory cell 35. Specifically, for the example wherein memory cell 35 is a flash memory cell, the range of possible cell threshold voltages Vt provides a programming window that may be subdivided into a number of distinct states. The number of states into which the programming window is divided determines the number of bits stored by the memory cell 35. For example, if a programming window is subdivided into only two states, memory cell 35 is capable of storing only one bit of data. Alternatively, if a programming window is subdivided into eight distinct states, memory cell 35 is capable of storing 3 bits of data.

Figure 6:
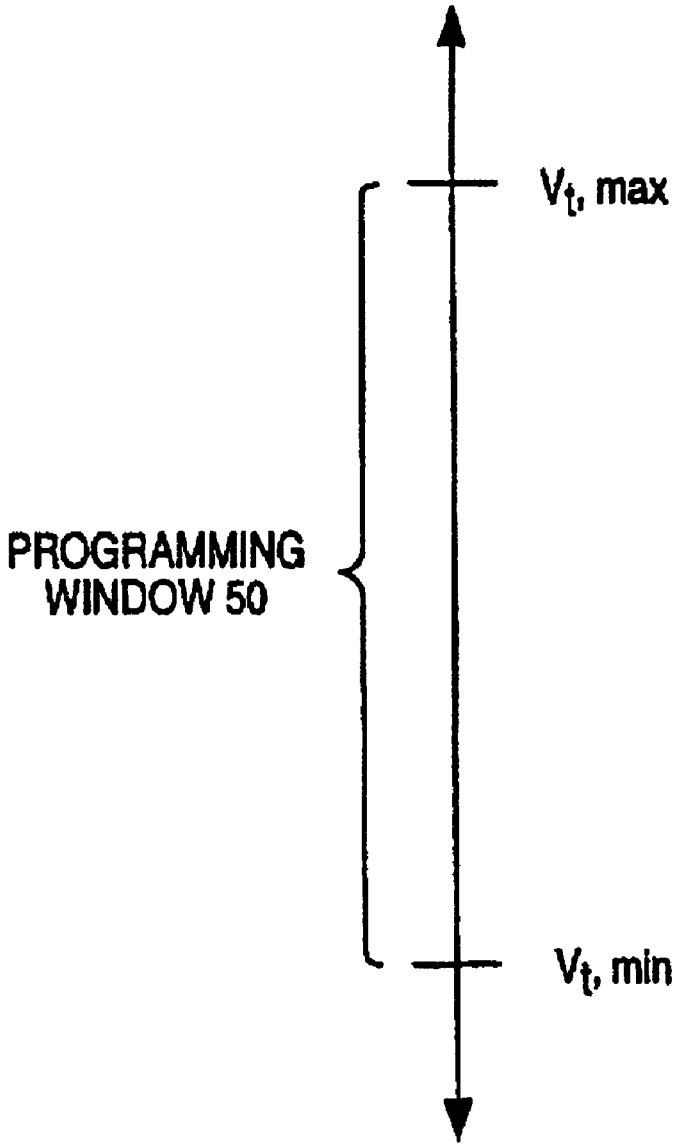
FIG. 6 is a programming window for a nonvolatile memory cell.

FIG. 6 shows a programming window 50 as a function of the threshold voltage $V_t$. As shown, a minimum threshold voltage $V_{t,min}$ defines a lower boundary of the programming window 50, and a maximum threshold voltage $V_{t,max}$ defines an upper bound of the programming window 50. The lower bound of programming window 50 is determined primarily by over-erased conditions of the flash memory cell, and the upper bound of programming window 50 is determined primarily by maximum programming voltages and cell disturbs.

According to the present embodiments, the read voltage $V_G$ is selected to be greater than the maximum threshold voltage $V_{t,max}$. The source voltage $V_S$ is selected to be equal to $(V_{t,max}-V_{t,min})$, which is the maximum possible swing of the bitline. When these constant voltages are applied to wordline 40 and the source S of a memory cell 35, bitline 45 coupled to the drain D of memory cell 35 will eventually achieve a DC value proportional to $(V_G-V_t)$. For one embodiment, the read voltage $V_G$ is approximately 5.5 volts and the source voltage $V_S$ is approximately 3.0 volts.

Figure 7:
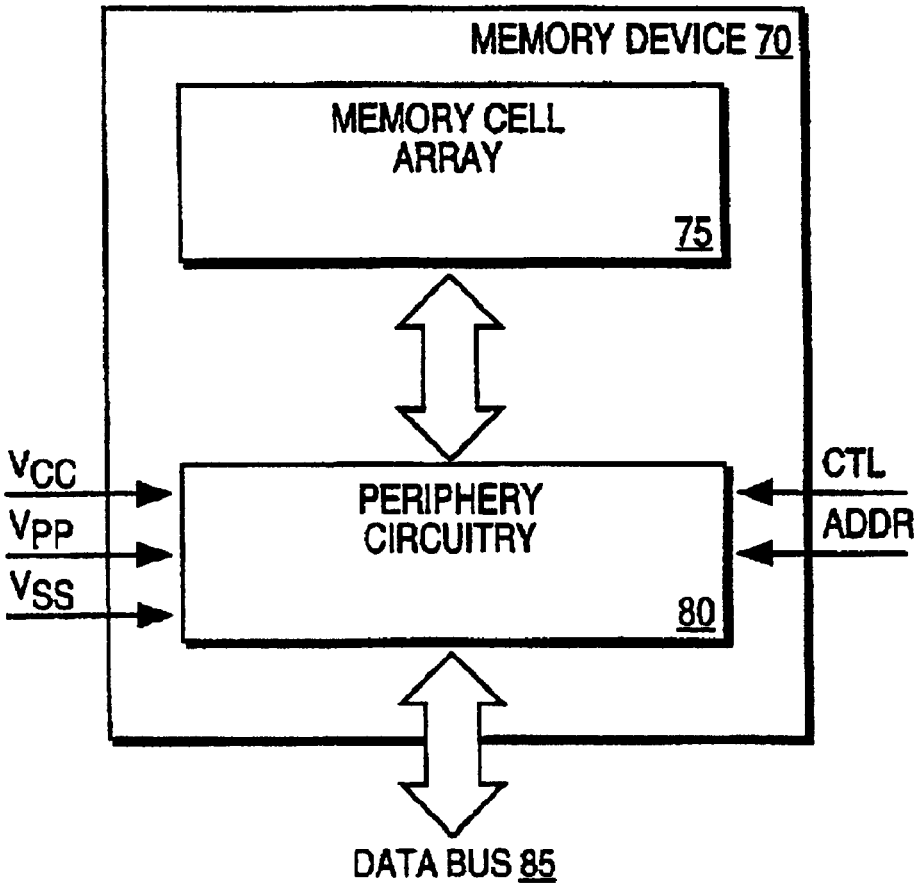
FIG. 7 is a memory device including a memory cell array and periphery circuitry.

FIG. 7 shows one embodiment of a memory device 70 that includes a memory cell array 75 and periphery circuitry 80. Memory cell array 75 comprises a multiplicity of memory cells arranged in rows (wordlines) and columns (bitlines) such as those shown in FIG. 8. Periphery circuitry 80 includes circuitry for reading and writing of data to the memory cell array 75 and an interface to the data bus 85. Periphery circuitry 80 is shown as including power supply inputs $V_{CC}$ and $V_{SS}$, programming voltage $V_{PP}$, control inputs CTL (including chip enable, output enable, etc.), address inputs ADDR, and an I/O path to data bus 85.

Figure 8:
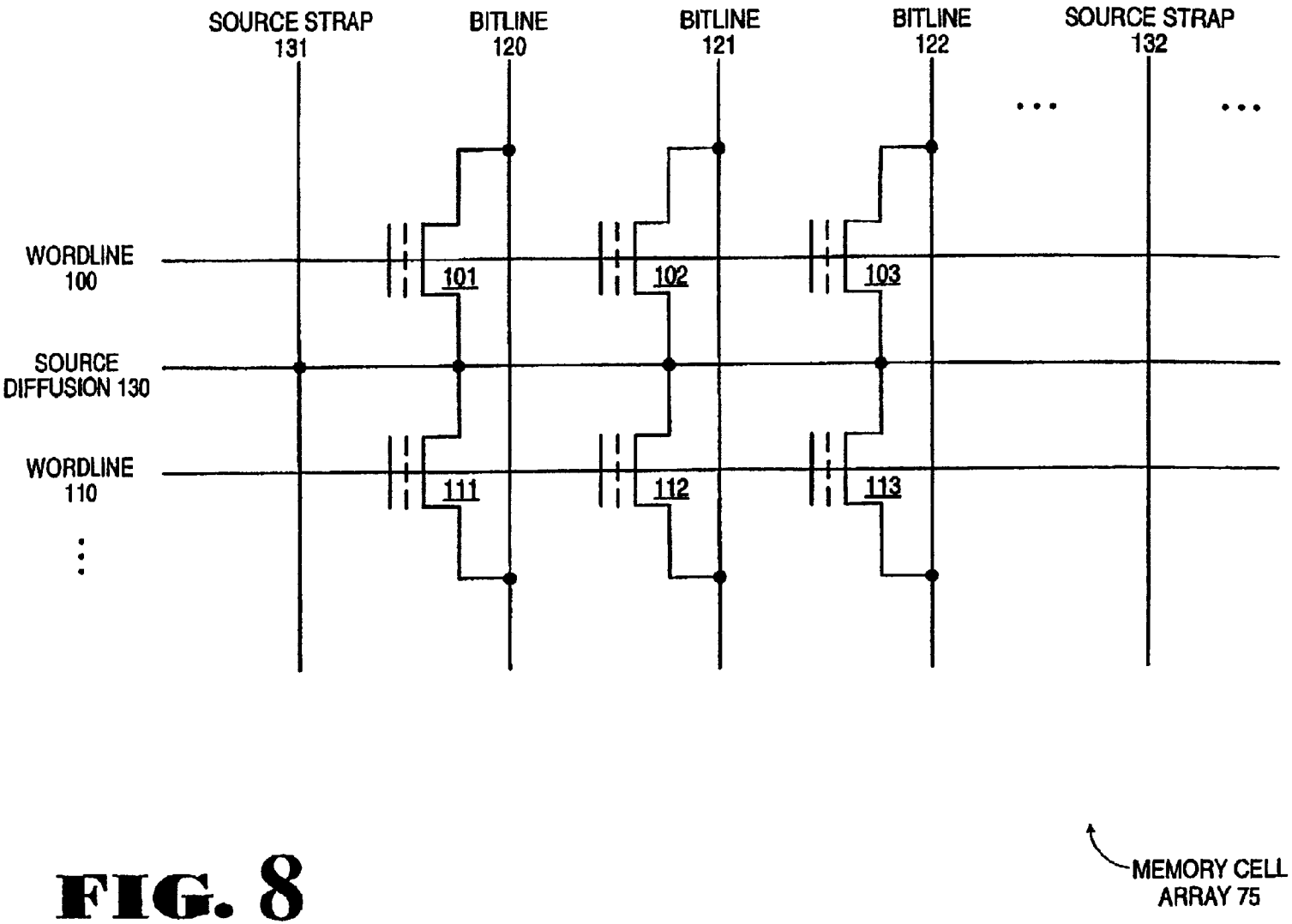
FIG. 8 is one embodiment of a memory cell array of FIG. 7 including wordlines, bitlines, source straps, source diffusion, and memory cells.

FIG. 8 shows one embodiment of memory cell array 75. Depending upon the storage capacity of memory device 70, memory cell array 75 may include several hundreds of bitlines and several hundreds of wordlines. FIG. 8 shows a sub-section of memory cell array 75 that includes a plurality of memory cells 101–103, all of which are coupled to wordline 100, and another plurality of memory cells 111–113, all of which are coupled to wordline 110. Bitline 120 is shown as being coupled to the drains of memory cells 101 and 111, bitline 121 is shown as being coupled to the drains of memory cells 102 and 112, bitline 122 is shown as being coupled to the drains of memory cells 103 and 113. Each of the memory cells 101–103 and 111–113 are shown as having their sources coupled to a source diffusion 130 that is coupled to a source strap 131. Additional bitlines, wordlines, source diffusions, source straps, and memory cells are implied by FIG. 8.

Memory cell carry 75 of FIG. 8 may be manipulated in the manner shown in FIGS. 2–5 by appropriately applying voltages to bitlines 120–122, source straps 131–132, and wordlines 100 and 110. As may be seen, a voltage applied to a particular wordline will be applied to the select gates of all of the memory cells coupled to that wordline. For example, applying a voltage to wordline 100 will result in each of the memory cells 101–103 having that voltage applied to their select gates. As will be discussed with respect to FIG. 10, the manipulation of wordlines 100 and 110, bitlines 120–122, and source straps 131–132 may be done using conventional circuitry.

Figure 9:
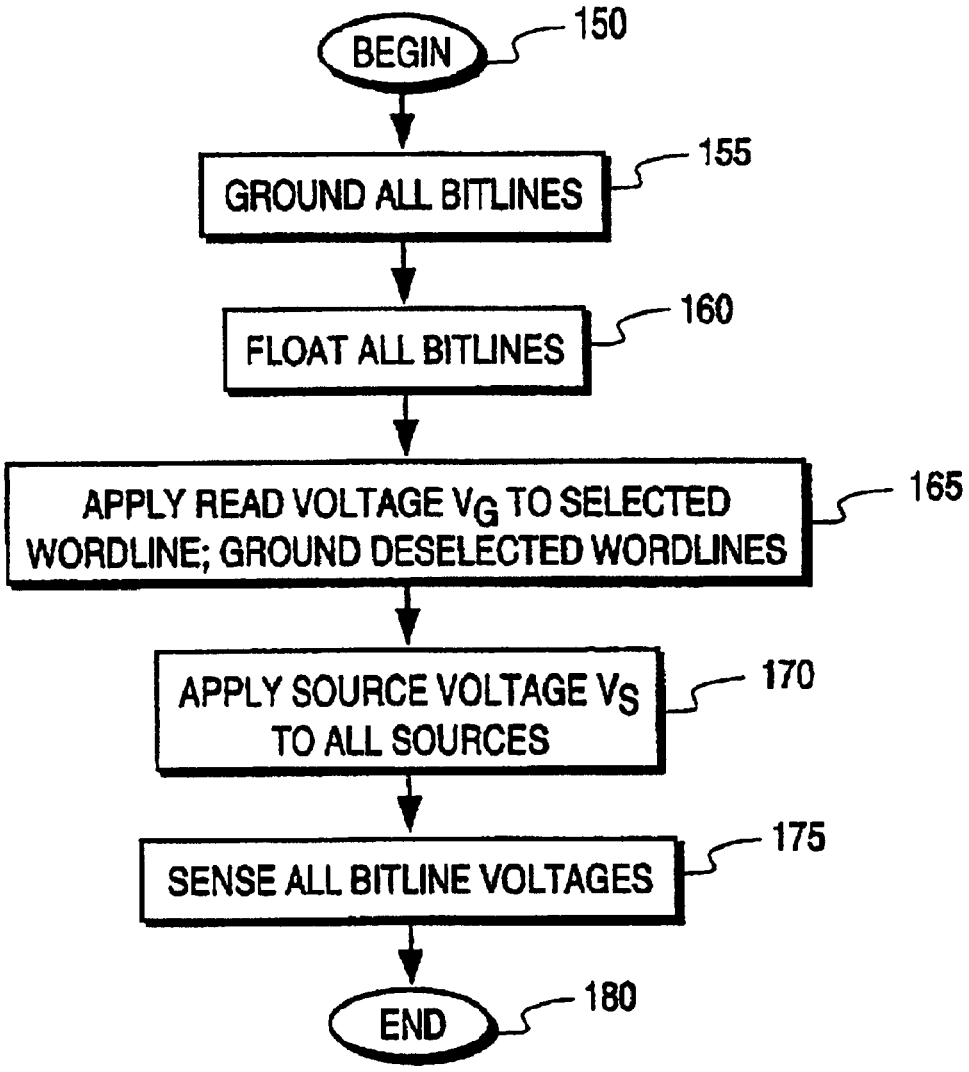
FIG. 9 is a method for sensing data stored in memory cells coupled to a wordline.

FIG. 9 summarizes a method for reading all of the memory cells coupled to a single wordline (e.g. wordline 100 of FIG. 8). The process begins at process block 150 typically in response to receiving a read request as decoded from the control signals of memory device 70. At process block 155, all bitlines of the memory cell array 75 are grounded, and the bitlines are floated at process block 160. The actions of process blocks 155 and 160 may be performed concurrently with the decoding of an address by the row and column decoders of memory device 70 (shown in FIG. 10). Given that all of the memory cells coupled to a wordline may be simultaneously sensed, the use of a column decoder may not be required.

At process block 165, the read voltage $V_G$ is applied to the selected wordline, and deselected wordlines are grounded to prevent the switching on of the memory cells attached to the deselected wordlines. Again, the read voltage $V_G$ that is applied to the selected wordline is selected to be greater than the maximum threshold voltage $V_{t,max}$ obtainable by a memory cell of memory cell array 75.

At process block 170, a source voltage $V_S$ is applied to all the sources of all the memory cells in memory array 75 by coupling the source voltage $V_S$ to the source straps of the memory cell array. For other layouts of memory cell array 75, the source voltage $V_S$ may not necessarily be applied to all the sources of the memory cells; however, the present scheme will work so long as all of the memory cells of the memory cell array 75 that are to be read have their sources set to the appropriate source voltage $V_S$.

A predetermined period of time is allowed to elapse so that the bitlines coupled to the selected memory cells are allowed to achieve a steady state voltage proportional to $(V_G-V_t)$. Each of bitlines 120–122 may have a different voltage as determined by the threshold voltages $V_t$ of each of memory cells 101–103. At process block 175 bitline voltages for each of bitlines 120–122 of the memory cell array 75 are sensed. The bitlines may be sensed in parallel or subsets of the bitlines may be sensed sequentially. For example, given 1024 bitlines, the periphery circuitry 80 of the memory device 70 may be configured to sense the voltages of all the bitlines in parallel or to sense a subset of the bitlines at a time (e.g. sixteen). So long as the read voltage $V_G$ and the source voltage $V_S$ are applied to the memory cells of the selected wordline, the bitline voltages on bitlines 120–122 will maintain a DC value proportional to $(V_G-V_t)$.

Providing sufficient time to allow bitlines 120–122 to achieve a DC voltage may require a longer period of time than normally required by prior art sensing schemes; however, the fact that all of the memory cells of an entire wordline may be sensed in parallel allows the time to be amortized over all of the memory cells of a wordline such that the average time to access the data of each memory cell is significantly reduced over the prior art. Under this scheme no drain bias circuit is required because no cell current is required. Similarly, a differential sense amplifier is also not required. Because, the value of the read voltage $V_G$ and the maximum swing of the threshold voltage $V_t$ are known, an analog to digital converter may be used to convert the voltage of a bitline into a digital value, therefore not requiring a sense amplifier.

Figure 10:
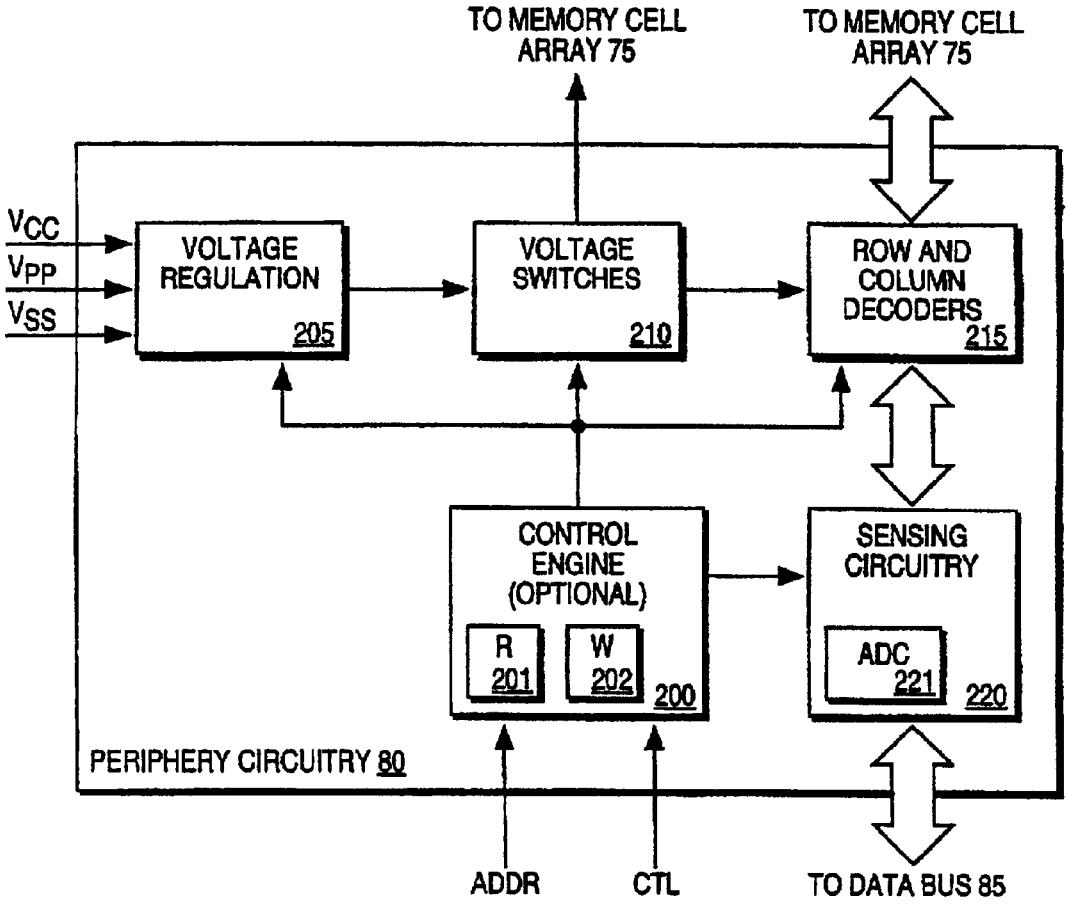
FIG. 10 is one embodiment of periphery circuitry of FIG. 7 including a voltage regulation circuit, voltage switches, row and column decoders, sensing circuitry, and an optional control engine.

FIG. 10 shows the periphery circuitry 80 of the memory device 70 for one embodiment. Periphery circuitry 80 generally comprises voltage regulation circuitry 205, voltage switches 210, row and column decoders 215, and sensing circuitry 220.

Periphery circuitry 80 is also shown as including an optional control engine 200 that includes a read algorithm "R" 201 and a write algorithm "W" 202 that control engine 200 uses to control the periphery circuitry 80 for accessing the memory cell array 75. Control engine 200 may alternatively be provided externally to the memory device 70. Control engine 200 is coupled to receive the address and control signals such that it can appropriately control the voltage regulation circuitry 205, voltage switches 210, and the row and column decoders 215.

The voltage regulation circuitry 205 is coupled to receive the external supply voltages $V_{CC}$, $V_{PP}$, and $V_{SS}$. Typically, values of $V_{CC}$ and VPP are 5 volts and 12 volts, respectively. However, for some embodiments $V_{CC}$ and $V_{PP}$ may be the same voltage, (e.g. 5.0 volts or 3.3 volts). The voltage regulation circuitry 205 may include charge pumps, DC-to-DC converters, and/or voltage dividers for producing the read voltage $V_G$ and the source voltage $V_S$.

The voltage switches 210 are coupled to the voltage regulation circuitry 205 and to the wordlines, bitlines, and source straps of memory cell array 75. Voltage switches 210 selectively provides the desired voltages (e.g. source voltage $V_S$) to the memory cell array in response to control signals provided by the control engine 200.

The row decoders of row and column decoders 215 are coupled to the voltage switches 210 for receiving the read voltage $V_G$ and supplying the read voltage $V_G$ to a wordline of memory cell array 75 indicated by the address transmitted received from the address lines ADDR. As previously mentioned, column decoders are optional and may be used merely to multiplex sensing circuitry 220 to sense specific subsets of bitlines 120–122 of the memory cell array 75. If no column decoders are provided, sensing circuitry 220 will sense all of the bitlines of the memory cell array 75 in parallel.

Sensing circuitry 220 is shown as including analog to digital converter "ADC" 221 that translates the voltages sensed at bitlines 120–122 to digital values. Sensing circuitry 220 may include latches for storing the sensed voltages such that all of the voltages on bitlines 120–122 may be dumped into the latches and sequentially output in smaller subsets to data bus 85.

The memory device architecture shown in FIGS. 7–10 illustrate a nonvolatile memory device having a page mode read operation. If latches or another form of memory are provided in sensing circuitry 220, an entire wordline of memory cells may be stored in a cache-like fashion wherein a wordline of data is fetched at a time from memory cell array 75. Subsequent accesses to memory cell array 75 are done entirely within a buffer memory of sensing circuitry 220 (not shown) using row and column decoders 215. Subsequent accesses will continue to be made to the buffer memory of sensing circuitry 220 instead of memory cell array 75 until data is attempted to be fetched from memory cell array 75 that is not stored in sensing circuitry 220.

In the foregoing specification the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than restrictive sense.

What is claimed is:

1. A method for determining data stored by a memory cell having a select gate coupled to a wordline, a first electrode coupled to a bitline, and a second electrode coupled to a conductor, comprising the steps of:

floating the bitline;

applying a first voltage to the wordline;

applying a second voltage to the conductor such that the bitline is set to a third voltage that is equal to the first voltage minus a threshold voltage of the memory cell; and sensing the third voltage to determine the data stored by the memory cell.

2. The method of claim 1, further comprising an initial step of setting the bitline to a ground potential.

3. The method of claim 1, wherein the memory cell is a nonvolatile memory cell.

4. A method for simultaneously determining data stored by a plurality of memory cells each having a select gate coupled to a wordline, a first electrode coupled to one of a plurality of bitlines, and a second electrode coupled to a conductor, comprising the steps of:

floating the plurality of bitlines;

applying a first voltage to the wordline;

applying a second voltage to the conductor such that the plurality of bitlines is set to a plurality of third voltages, wherein one of the plurality of third voltages is equal to the first voltage minus a threshold voltage of one of the plurality of memory cells; and sensing the plurality of third voltages to determine the data stored by the plurality of memory cells.

5. The method of claim 4, further comprising an initial step of setting the plurality of bitlines to a ground potential.

6. The method of claim 4, wherein the plurality of memory cells are nonvolatile memory cells.

7. The method of claim 4, wherein determining the data stored by the plurality of memory cells comprises reading a page of data.

8. A method for determining data stored by a memory cell having an adjustable threshold voltage, a select gate coupled to a wordline, a first electrode coupled to a bitline, and a second electrode coupled to a conductor, comprising the steps of:

floating the bitline;

applying a first voltage to the wordline;

applying a second voltage to the conductor such that the bitline is set to a third voltage;

determining the adjustable threshold voltage of the memory cell based on the third voltage; and determining the data stored in the memory cell based on the adjustable threshold voltage of the memory cell.

9. A memory device comprising:

a memory array having data stored in a memory cell, the memory cell having a select gate coupled to a wordline, a first electrode coupled to a bitline, and a second electrode coupled to a conductor; and a periphery circuit coupled to the memory array, the periphery circuit transmitting a first voltage to the wordline and transmitting a second voltage to the conductor such that the bitline is set to a third voltage that is equal to the first voltage minus a threshold voltage of the memory cell, wherein the periphery circuit senses the third voltage to determine the data stored by the memory cell.

10. The memory device of claim 9, wherein the periphery circuit further transmits a ground potential to the bitline before transmitting the first voltage or the second voltage to the memory cell.

11. The memory device of claim 9, wherein the memory cell is a nonvolatile memory cell.

12. The memory device of claim 9, wherein the periphery circuit comprises:

a voltage regulation circuit outputting the first voltage and the second voltage;

a voltage switching circuit coupling the second voltage to the memory cell; and a sensing circuit coupled to the memory cell, wherein the sensing circuit senses the third voltage to determine the data stored by the memory cell.

13. The memory device of claim 12, further comprising:

a decoder circuit receiving the first voltage from the voltage switching circuit and coupling the first voltage to the memory cell, the decoder circuit decoding a location of the memory cell in the memory array.

14. The memory device of claim 12, further comprising:

a control circuit having read circuitry and write circuitry each coupled to the voltage regulation circuit, the voltage switching circuit, and the sensing circuit, wherein the control circuit controls when the first voltage and the second voltage are supplied to the memory cell and when the third voltage is sensed by the sensing circuit.

15. The memory device of claim 12, wherein the sensing circuit comprises:

an analog-to-digital converter circuit operative to receive the third voltage and generate a digital value.

16. A memory device comprising:

a memory array having data stored in a plurality of memory cells, the plurality of memory cells each having a select gate coupled to a wordline, a first electrode coupled to one of a plurality of bitlines, and a second electrode coupled to a conductor; and a periphery circuit coupled to the memory array, the periphery circuit transmitting a first voltage to the wordline and transmitting a second voltage to the conductor such that the plurality of bitlines is set to a plurality of third voltages, wherein one of the plurality of third voltages is equal to the first voltage minus a threshold voltage of one of the plurality of memory cells, and wherein the periphery circuit simultaneously senses the plurality of third voltages to determine the data stored by the memory array.

17. A memory device comprising:

a memory array having data stored in a memory cell having an adjustable threshold voltage; and a periphery circuit coupled to the memory array, the periphery circuit transmitting a plurality of voltages *comprising a first voltage and a second voltage* to the memory cell and sensing the adjustable threshold voltage of the memory cell to determine the data stored by the memory cell *by sensing a third voltage, the third voltage being equal to the first voltage minus a threshold voltage of the memory cell*.

18. A memory device comprising:

means having an adjustable threshold voltage for storing data; and means coupled to the storing means *for transmitting a first voltage and a second voltage to the storing means and* for determining the data stored in the storing means by sensing the adjustable threshold voltage *by sensing a third voltage, the third voltage being equal to the first voltage minus a threshold voltage of the storing means*.

* * * * *